United States Patent
Ramaswamy et al.

(10) Patent No.: US 7,530,814 B2
(45) Date of Patent: May 12, 2009

(54) PROVIDING VARIABLE SIZED CONTACTS FOR COUPLING WITH A SEMICONDUCTOR DEVICE

(75) Inventors: Chandrashekhar Ramaswamy, Chandler, AZ (US); Thomas G. Ruttan, Lake Oswego, OR (US); Mark D. Summers, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/903,962

(22) Filed: Sep. 25, 2007

(65) Prior Publication Data

US 2009/0081889 A1 Mar. 26, 2009

(51) Int. Cl.
  *H01R 12/00* (2006.01)
(52) U.S. Cl. ........................ 439/66; 439/924.1; 439/862
(58) Field of Classification Search .................. 439/66, 439/862, 924.1
  See application file for complete search history.

(56) References Cited

U.S. PATENT DOCUMENTS

| | | | |
|---|---|---|---|
| 3,971,610 A * | 7/1976 | Buchoff et al. ................. | 439/75 |
| 5,324,205 A * | 6/1994 | Ahmad et al. .................. | 439/66 |
| 6,074,219 A * | 6/2000 | Tustaniwskyj et al. ......... | 439/66 |
| 6,287,126 B1 * | 9/2001 | Berger et al. .................. | 439/66 |
| 6,419,500 B1 * | 7/2002 | Kister ........................... | 439/66 |
| 6,752,635 B1 | 6/2004 | Searls et al. ................... | 439/71 |
| 6,802,720 B2 * | 10/2004 | Weiss et al. .................... | 439/66 |
| 6,827,586 B2 * | 12/2004 | Noda et al. .................... | 439/71 |
| 7,357,644 B2 * | 4/2008 | Dittmann ....................... | 439/66 |
| 2002/0098721 A1 * | 7/2002 | Fan et al. ....................... | 439/66 |
| 2002/0164894 A1 * | 11/2002 | Ruttan et al. .................. | 439/66 |
| 2002/0182900 A1 * | 12/2002 | Brodsky et al. ............... | 439/66 |
| 2004/0253846 A1 * | 12/2004 | Brown et al. .................. | 439/66 |
| 2005/0109455 A1 * | 5/2005 | Bai .............................. | 156/292 |
| 2006/0046527 A1 * | 3/2006 | Stone et al. .................... | 439/66 |
| 2007/0232090 A1 * | 10/2007 | Colgan et al. ................. | 439/66 |
| 2007/0259539 A1 * | 11/2007 | Brown et al. .................. | 439/66 |
| 2007/0275572 A1 * | 11/2007 | Williams et al. .............. | 439/66 |

OTHER PUBLICATIONS

U.S. Appl. No. 11/614,885, filed Dec. 21, 2006, entitled "Lateral Force Countering Load Mechanism For LGA Sockets," by Robert R. Martinson, et al.

U.S. Appl. No. 11/427,898, filed Jun. 30, 2006, entitled "Socket Assembly That Includes Improved Contact Arrangement," by Thomas G. Ruttan, et al.

\* cited by examiner

*Primary Examiner*—Tho D Ta
(74) *Attorney, Agent, or Firm*—Trop, Pruner & Hu, P.C.

(57) ABSTRACT

In one embodiment, the present invention includes a circuit board having integrated contacts to mate with corresponding pads of a semiconductor device. At least some of the integrated contacts are of varying sizes to enable different contact resistances between the corresponding integrated contacts and pads, enabling reduced loading forces to adapt the semiconductor device to the circuit board. Other embodiments are described and claimed.

14 Claims, 5 Drawing Sheets

PROVIDING VARIABLE SIZED CONTACTS FOR COUPLING WITH A SEMICONDUCTOR DEVICE

BACKGROUND

A socket can be used to attach a device such as a packaged semiconductor device to a printed circuit board (PCB). The typical loading required for a so-called land grid array (LGA) socket to enable contact deflection generates lateral device (e.g., package) displacement driven by contact-to-device frictional forces. Package lateral displacement may continue until the device (e.g., package) comes in contact with the socket sidewall. This loading force and lateral displacement can be fairly significant, and can cause damage.

As semiconductor devices such as central processing units (CPU) have increasing pin counts, the enabling load required by a traditional CPU socket is proportionally increasing. Current socket technology provides a single contact height and shape. This limitation is mainly due to current manufacturing process setup and the requirement of a generic socket that is not custom to a given device's pinout. Furthermore, compressive load requirements for high pin count sockets (with stamped metal contacts) increases with the additional pin counts and resistivity required in advanced semiconductor devices.

DETAILED DESCRIPTION

Figure 1:
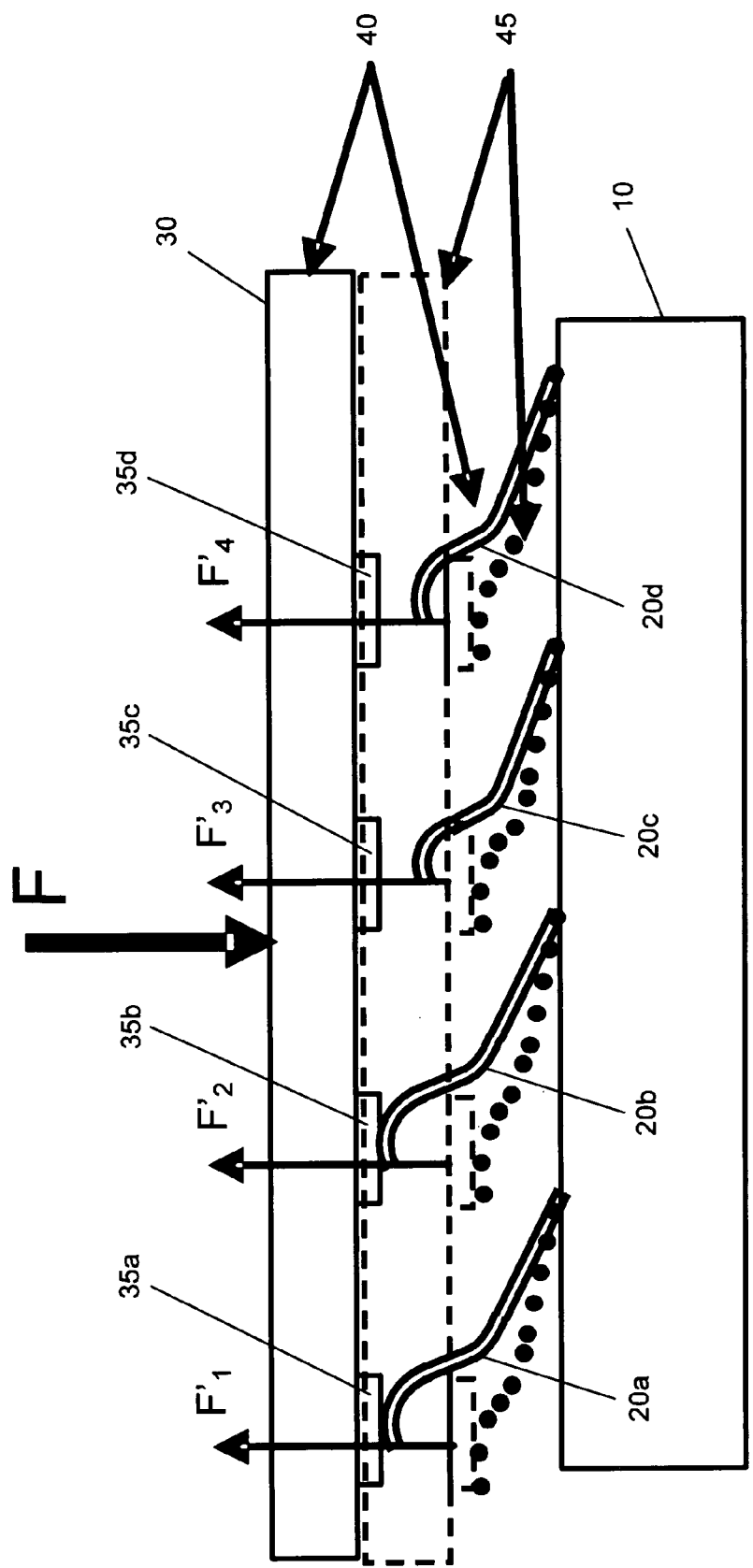
FIG. 1 is a cross-section view of a loading of a semiconductor device to a substrate in accordance with one embodiment of the present invention.

In various embodiments, contacts are provided to enable coupling of a semiconductor device to a substrate. Such contacts may have varying sizes, including varying contact heights, widths, and shapes to result in tailoring the bending stiffness of such contacts. In this way, these contacts, which may be used to adapt a semiconductor package such as a processor package to a substrate such as a printed circuit board (PCB), may enable a lowering of the overall package enabling load. Furthermore, in some embodiments such contacts, which may be land grid array (LGA) contacts, may be integrated directly on a surface of the circuit board. As a result, bending stiffness of these contacts may be tailored (e.g., in height and shape of contacts) based on differing contact resistance requirements. As a result, lower overall enabling package load may be realized, improving socket package reliability.

In some embodiments, bending stiffness of contacts may be customized for different platforms such that a resulting force on power pins is sufficient to maintain a maximum contact resistance of approximately 15 milliohms (mohm), while the force on data contacts such as input/output (I/O) contacts may be sufficiently lower such that a maximum resistance of approximately 100 mohms may be maintained. In this way, as I/O pin counts can account for greater than 50% of total socket pin counts, improved package reliability may be realized with overall reduced loading force.

While some embodiments may customize bending stiffness based on a type of contact (e.g., power or I/O) in these and other embodiments, such differing contact sizes may also be based on a location of a contact within a contact array. For example, in some implementations contacts that are more internal to the array than peripheral contacts may be of a different size (e.g., taller and thicker), although the scope of the present invention is not limited in this regard. While some embodiments may be implemented using a conventional stamped metal contacts that are configured in a socket that is then adapted to a motherboard or other circuit board, in many implementations integrated contacts on a surface of the circuit board may remove design constraints and enable use of customized contact stiffness and size.

Embodiments may take advantage of the fact that power and I/O pins have very different requirement for contact resistance. Power connectors for processor sockets typically require approximately 10-20 mohm resistance and I/O pins requirements are an order of magnitude higher (approximately 100 mohm). Since contact resistance is a function of force applied to the contact, which in turn is dependent on: displacement from uncompressed state; the physical shape of the contacts that determine the basic spring force of the contacts; or a combination of the two, the bending stiffness for the power and I/O contacts can be tailored. In some embodiments, PCB integrated contacts can be formed using photolithography and etch techniques and the process may be conducive to design contacts of different geometries. Then a stamping process to form the contacts uses a single die across the whole array and once again this can be tailored to ensure the power and I/O contacts form to different heights and shapes. In contrast, conventional processes require that all contacts be the same height to allow for a gang stitching operation, resulting in a significant overloading of the I/O contacts (and hence overall total load). Embodiments may thus provide different contact heights or shapes for the power and I/O contacts tailored bending stiffness and consequently load optimization for each contact type and overall load reduction.

Referring now to FIG. 1, shown is a cross-section view of a loading of a semiconductor device 30 to a circuit board 10. As shown in FIG. 1, circuit board 10 includes a plurality of contacts $20_a$-$20_d$ (generically contact 20). In the embodiment of FIG. 1, contacts 20 may be integrally formed on a top surface of circuit board 10, rather than conventional stamped metal contacts within a socket package. Note that at least some of the contacts may be of different sizes, e.g., height and thickness. For example, contacts $20_a$ and $20_b$ are higher than contacts $20_c$ and $20_d$. In this way, providing tailored bending stiffness, load optimization for each contact type may be realized. As a result, the forces needed for loading of contacts $20_a$ and $20_b$, i.e., $F'_1$ and $F'_2$, may be greater than that required for contacts $20_c$ and $20_d$, i.e., forces $F'_3$ and $F'_4$. Note the different positions of contacts 20 in an unloaded state 40 and a loaded state 45. As shown, contacts 20 may thus make electrical connection with corresponding ones of lands $35_a$-$35_d$ of semiconductor device 30.

Figure 2:
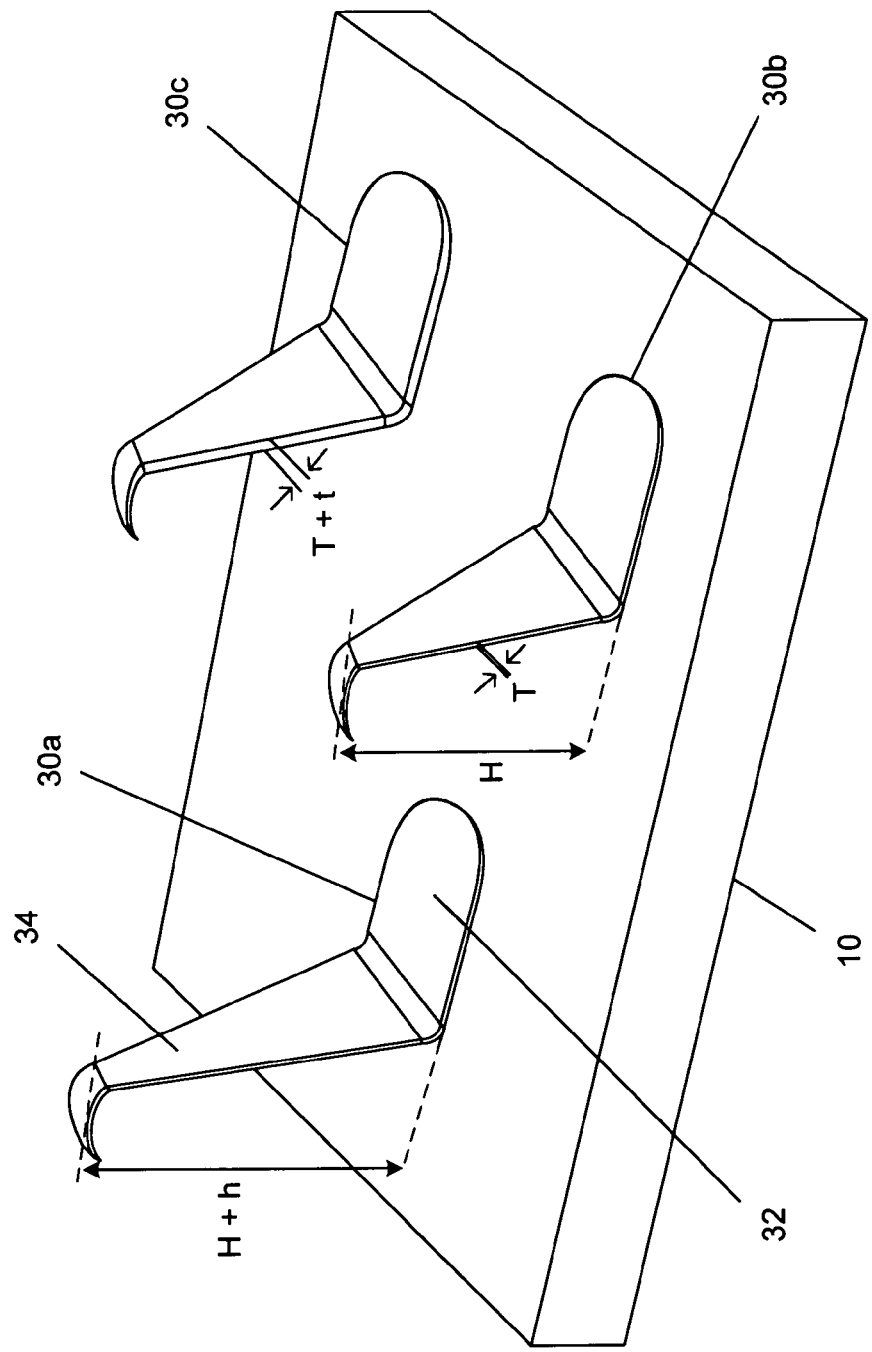
FIG. 2 is a plan view of a portion of a circuit board in accordance with an embodiment of the present invention.

Referring now to FIG. 2, shown is a plan view of a portion of a circuit board 10 in accordance with an embodiment of the present invention. As shown in FIG. 2, circuit board 10 includes three integrated contacts $30_a$, $30_b$ and $30_c$. Specifically, each contact 30 includes a pad portion 32, which may mate with a corresponding pad on circuit board 10. Note however, in embodiments in which contacts 30 are integrated as part of motherboard 10, it may be possible that pad 32 is formed, e.g., by a photolithography process to directly mate with a corresponding via or other interconnect structure (not shown in FIG. 2) to thus make contact to an underlying power or I/O layer of the circuit board. Note further that each contact 30 may include a pin portion 34, which may provide interconnection to a corresponding land of the semiconductor device. In the embodiment of FIG. 2, contact $30_a$ may be taller than contacts $30_b$ and $30_c$ (i.e., having a height of H+h), in contrast to the height H of contacts $30_b$ and $30_c$. In one embodiment, contacts $30_a$ and $30_c$ are for power pins while contact $30_b$ is for an I/O pin. Furthermore, note that at least contact $30_c$ may have a larger thickness (i.e., a thickness of T+t) rather than the thickness T of contact $30_b$. Such thicker width may be realized by selective plating, in one embodiment. By providing contacts having customized designs, contacts $30_a$ and $30_c$ (for example) may be used to provide contact to power lands of a semiconductor device, while contact $30_b$ may be used to provide contact to an I/O land (for example). Generally, power contacts may be of a larger height and thicker than I/O contacts, to accommodate the greater force needed to provide the resistivity level of the resulting connection. In addition to greater normal force which reduces contact resistance, the greater thickness may even allow more current to be carried. In this way, potentially fewer contacts may be needed for a given voltage requirement.

While not shown in the embodiment of FIG. 2, understand that while contacts may be integrated directly onto motherboard 10, a socket implementation is still possible. That is, a socket body, i.e., frame may be adapted about contacts 30 for later coupling of a corresponding integrated circuit (IC). In such embodiments, contacts may be formed as part of the manufacture of the motherboard. Then, the socket body, such as an injection-molded frame, may be affixed to the motherboard. A solder bonding or other such connection mechanism may be realized to adapt the socket body to circuit board 10 in one embodiment. Finally, an IC package having lands or other such pads may mate with pins 34 of contacts 30. When so mated, contacts associated with power pins may thus be adapted to provide power from power planes of circuit board 10 to the IC, while signal pins associated with signal contacts may be adapted to communicate signals between signal layers of circuit board 10 and the IC.

Thus by integrating contacts into a circuit board structure, it is possible to customize and optimize the design of the contacts used for power delivery in I/O functions separately. As a result, the stiffness of the contacts may be different, with the stiffness of the I/O contacts typically lower than that for power pins. By customizing contact stiffness, lower force requirements for the I/O pins may be realized, and accordingly, the overall socket enabling force is reduced. In this way, different targets for contact resistance for I/O power and I/O pins may be realized, as the power delivery contacts require a lower resistance, while the I/O contacts can function with higher resistance. With this type of socket design, uneven loading of the package and socket across the contact array due to the different forces of the power delivery and I/O contacts may occur. Uniform application of the force on the package and IC structure may overcome this issue, where the force is distributed evenly across the surface with a sufficiently rigid loading device to prevent warpage or buckling of the package.

Figure 3:
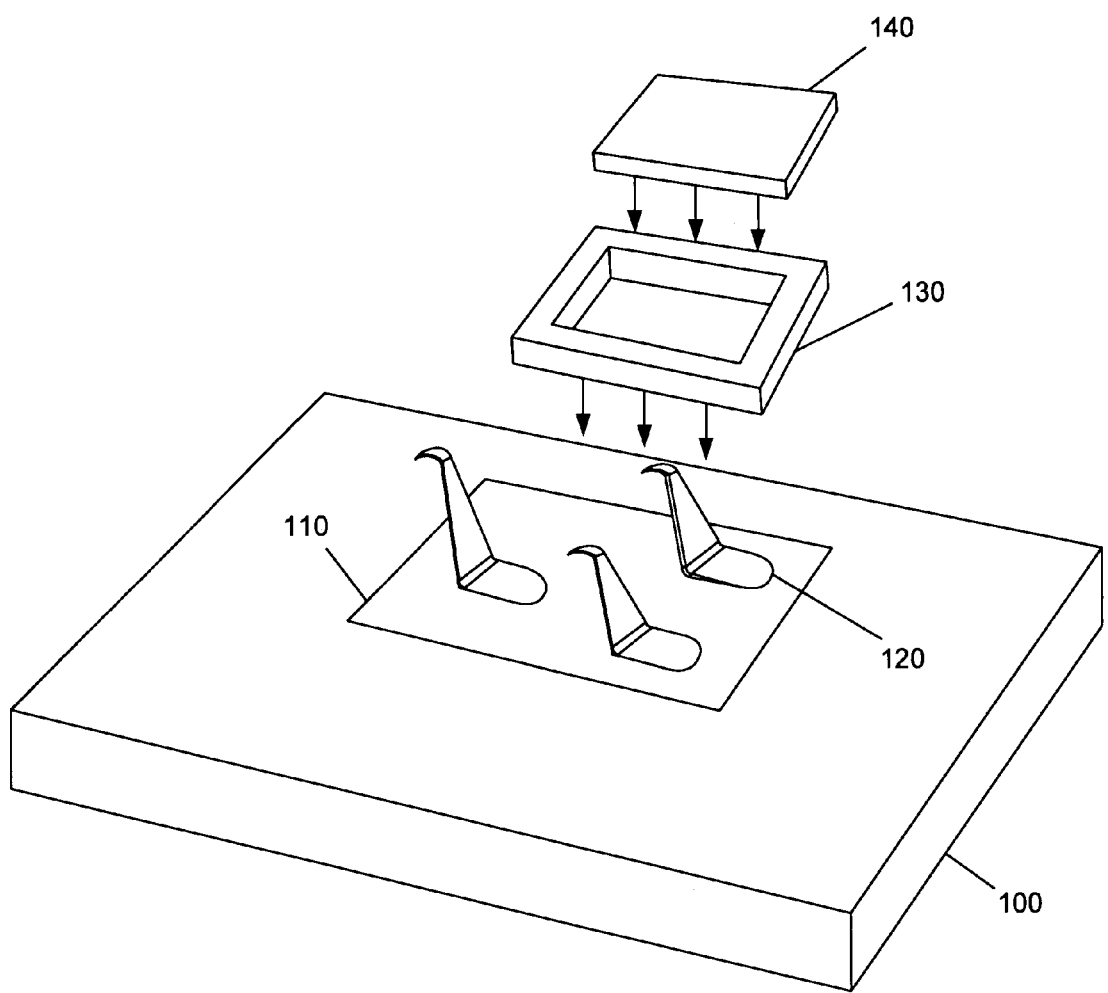
FIG. 3 is a block diagram of a portion of a system in accordance with an embodiment of the present invention.
Figure 3A:
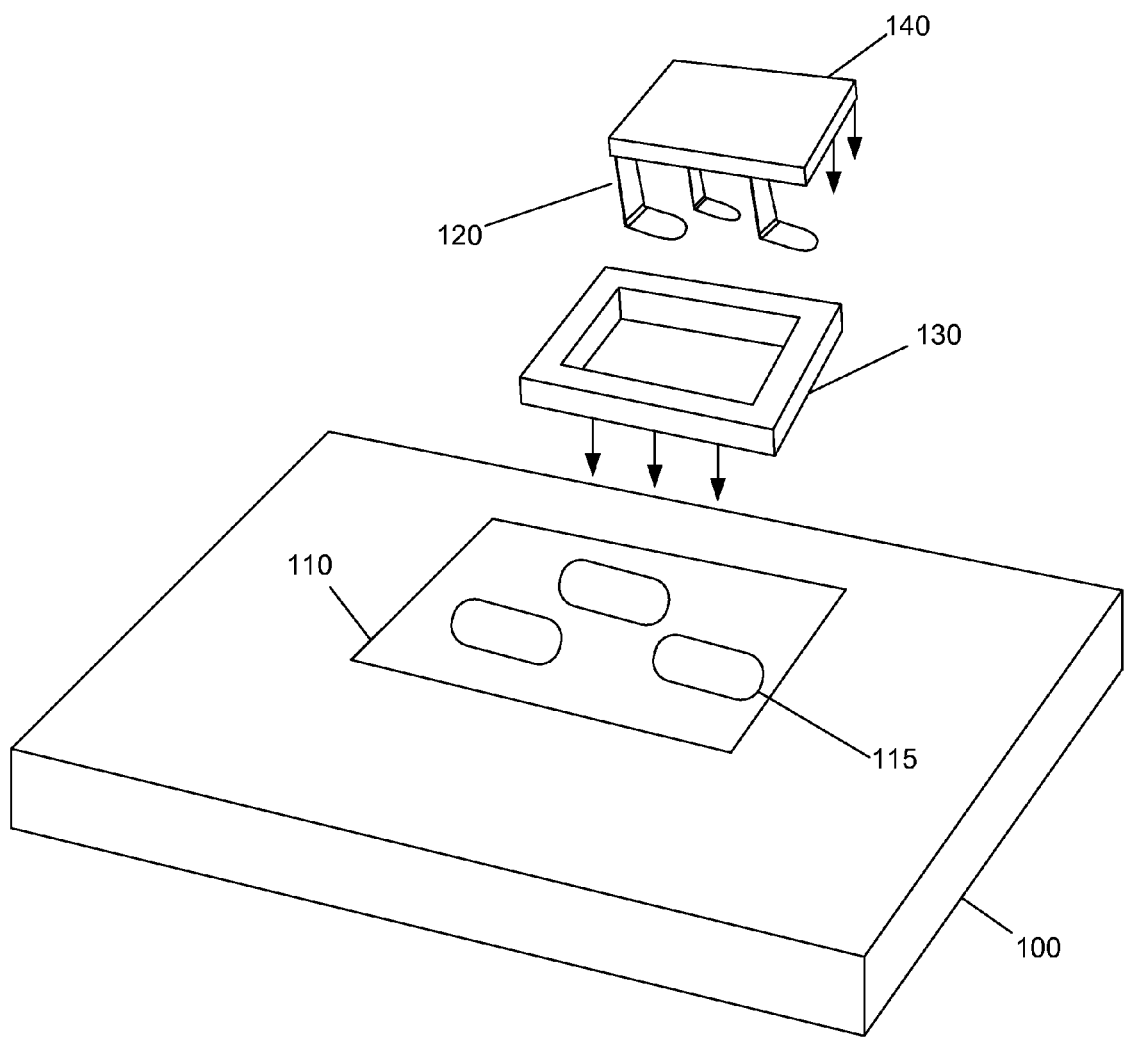
FIG. 3A is a block diagram of a portion of a system in accordance with one embodiment of the present invention.

Refeffing now to FIG. 3, shown is a block diagram of a portion of a system in accordance with an embodiment of the present invention. As shown in FIG. 3, the system includes a circuit board 100, such as a motherboard that has a contact field 110 including a plurality of contacts 120 which may be integrated on a top surface of circuit board 100. Then, during manufacture a socket frame 130, which may be a simple frame to constrain lateral movement of a semiconductor device 140, i.e., a processor package, when coupled to contacts 120 may be adapted around contact field 110. Finally, a loading force may be provided to couple corresponding lands of semiconductor package 140 (not shown in FIG. 3) to corresponding contacts 120, which may be of varying sizes based on a needed resistivity for a given type of connection (e.g., power or I/O). While shown with this particular implementation in the embodiment of FIG. 3, the scope of the present invention is not limited in this regard. For example, in other implementations, the variable sized contacts may be present on the semiconductor device and corresponding lands instead adapted on circuit board 100, as shown in FIG. 3A. In FIG. 3A the variable size contacts 120 are present on semiconductor package 140 and lands 115 are present in contact field 110.

Figure 4:
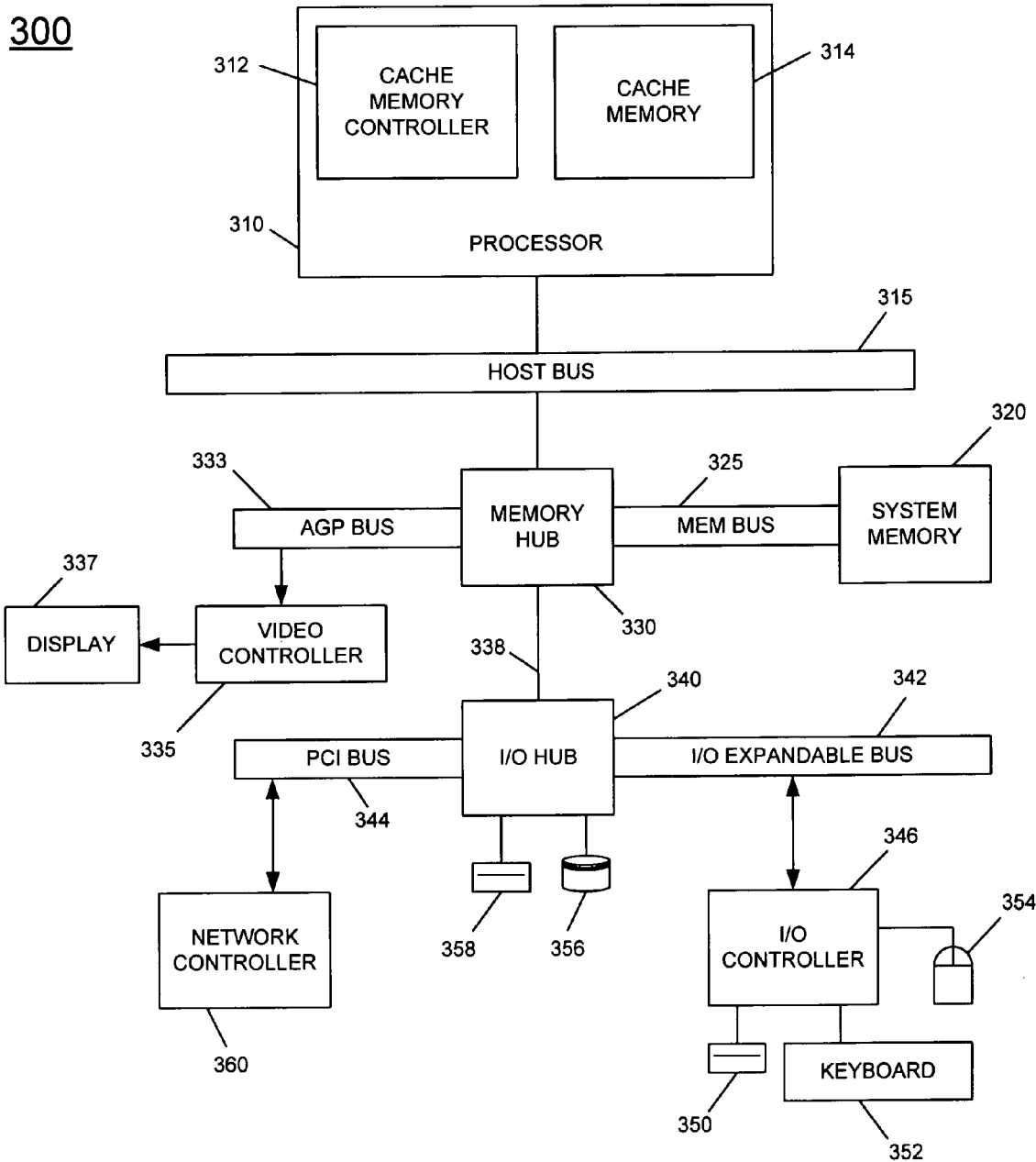
FIG. 4 is a block diagram of a computer system in which embodiments of the invention may be used.

Semiconductor packages to mate with LGA contacts of varying sizes formed in accordance with an embodiment may be used in various systems. FIG. 4 is a block diagram of a computer system 300 in which embodiments of the invention may be used. As used herein, the term "computer system" may refer to any type of processor-based system, such as a notebook computer, a server computer, a laptop computer, or the like.

Now referring to FIG. 4, in one embodiment, computer system 300 includes a processor 310, which may include a general-purpose or special-purpose processor such as a microprocessor, microcontroller, a programmable gate array, and the like. Processor 310 may include a cache memory controller 312 and a cache memory 314. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995. At least some of the various semiconductor components of system 300 may be adapted in packages having pads or lands to mate with contacts on a circuit board of system 300, either as part of a socket or integrated on the circuit board. The circuit board may include integrated contacts of varying sizes in accordance with one embodiment of the present invention.

I/O expansion bus 342 may be coupled to an I/O controller 346 that controls access to one or more I/O devices. As shown in FIG. 4, these devices may include in one embodiment storage devices, such as a floppy disk drive 350 and input devices, such as a keyboard 352 and a mouse 354. I/O hub 340 may also be coupled to, for example, a hard disk drive 358 and a compact disc (CD) drive 356, as shown in FIG. 4. It is to be understood that other storage media may also be included in the system.

PCI bus 344 may also be coupled to various components including, for example, a network controller 360 that is coupled to a network port (not shown). Additional devices may be coupled to the I/O expansion bus 342 and the PCI bus 344. Although the description makes reference to specific components of system 300, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a circuit board having a plurality of integrated contacts integrated on a surface thereof to directly mate with corresponding pads of a semiconductor device, wherein some of the plurality of integrated contacts are of varying sizes, the varying sizes to enable different contact resistances between the corresponding integrated contacts and pads, wherein a first set of the plurality of integrated contacts are of a first height and a second set of the plurality of integrated contacts are of a second height, the first height greater than the second height, wherein the first set of integrated contacts are to be associated with power pads of the semiconductor device to enable communication of power from a power plane of the circuit board to the power pads of the semiconductor device, and the second set of integrated contacts are to be associated with input/output (I/O) pads of the semiconductor device to enable communication of signals from a signal plane of the circuit board to the I/O pads of the semiconductor device.

2. The apparatus of claim 1, wherein at least some of the first set of integrated contacts are of a first thickness and the second set of integrated contacts are of a second thickness, the first thickness greater than the second thickness.

3. The apparatus of claim 1, wherein the first set of integrated contacts are to directly mate with the power pads to realize a first contact resistance and the second set of integrated contacts are to directly mate with the I/O pads to realize a second contact resistance, the first contact resistance less than the second contact resistance.

4. The apparatus of claim 1, wherein the varying sizes enable a reduced load to mate the semiconductor device with the integrated contacts.

5. The apparatus of claim 1, further comprising a socket frame adapted to the circuit board, wherein the socket frame is sized to surround the integrated contacts, and wherein the semiconductor device is to be loaded into the socket frame with a force less than a force to load the semiconductor device into a socket having contacts of a uniform size.

6. The apparatus of claim 1, wherein the circuit board is to mate with the semiconductor device without a corresponding socket package.

7. The apparatus of claim 1, wherein the plurality of integrated contacts each include a pad portion to directly mate with a via of the circuit board.

8. A system comprising:
a semiconductor device having a plurality of power lands and a plurality of input/output (I/O) lands;
a motherboard having a contact field including a first plurality of contacts and a second plurality of contacts integrated on a surface of the motherboard, the first plurality of contacts to directly mate with the power lands and the second plurality of contacts to directly mate with the I/O lands, wherein the first plurality of contacts are sized differently than the second plurality of contacts; and
a socket frame adapted around the contact field and attached to the motherboard, the socket frame to constrain the semiconductor device laterally.

9. The system of claim 8, wherein the differently sized contacts enable a reduced load to adapt the semiconductor device to the motherboard as compared to a force to load the semiconductor device into a socket having contacts of a uniform size.

10. The system of claim 8, wherein the first plurality of contacts are of a first height and the second plurality of contacts are of a second height, the first height greater than the second height, wherein the first plurality of contacts directly mate with the power lands of the semiconductor device, and the second plurality of contacts directly mate with the I/O lands of the semiconductor device.

11. The system of claim 9, wherein at least some of the first plurality of contacts are of a first thickness and the second plurality of contacts are of a second thickness.

12. The system of claim 10, wherein the first plurality of contacts mate with the power lands to realize a first contact resistance and the second plurality of contacts mate with the I/O lands to realize a second contact resistance, the first contact resistance less than the second contact resistance.

13. A system comprising:
an integrated circuit (IC) having a first plurality of contacts and a second plurality of contacts, wherein the first plurality of contacts are sized differently than the second plurality of contacts, the first plurality of contacts of a first height and the second plurality of contacts of a second height, the first height greater than the second height, the first plurality of contacts corresponding to power contacts and the second plurality of contacts corresponding to input/output (I/O) contacts;
a motherboard having a contact field including a plurality of lands to mate with the first plurality of contacts and a second plurality of lands to mate with the second plurality of contacts; and
a socket frame adapted around the contact field and attached to the motherboard, the socket frame formed of a peripheral frame having an open interior to constrain the IC laterally.

14. The system of claim 13, wherein at least some of the first plurality of contacts are of a first thickness and the second plurality of contacts are of a second thickness, the first thickness greater than the second thickness.

* * * * *